United States Patent [19]

Goumas et al.

[11] Patent Number: 4,680,523

[45] Date of Patent: Jul. 14, 1987

[54] APPARATUS AND METHOD FOR HANDLING ARTICLES IN AUTOMATED ASSEMBLY PROCESSES

[75] Inventors: Peter G. Goumas, Cary; Paul T. Wolfe, Apex, both of N.C.

[73] Assignee: Lord Corporation, Erie, Pa.

[21] Appl. No.: 839,346

[22] Filed: Mar. 13, 1986

[51] Int. Cl.⁴ ............................................. G05B 19/40
[52] U.S. Cl. .................................... 318/685; 318/696; 318/568
[58] Field of Search ............ 318/685, 696, 568, 568 D

[56] References Cited

U.S. PATENT DOCUMENTS

| | | | |
|---|---|---|---|
| 3,226,833 | 1/1966 | Lemelson | 33/143 |
| 3,261,479 | 7/1966 | Baker et al. | 214/1 |
| 3,449,008 | 6/1969 | Colechia | 294/88 |
| 3,509,583 | 5/1970 | Fraioli | 3/1.1 |
| 3,620,095 | 11/1971 | Dane | 74/469 |
| 3,770,140 | 11/1973 | Dukette | 214/1 BB |
| 3,895,729 | 7/1975 | Dukette | 214/152 |
| 3,904,234 | 9/1975 | Hill et al. | 194/106 |
| 3,948,093 | 4/1976 | Folchi et al. | 73/133 R |
| 4,001,556 | 1/1977 | Folchi et al. | 235/151 |
| 4,132,318 | 1/1979 | Wang et al. | 214/1 BB |
| 4,423,998 | 1/1984 | Inaba et al. | 414/730 |
| 4,533,167 | 8/1985 | Johnson | 294/86.4 |
| 4,546,443 | 10/1985 | Oguchi et al. | 364/513 |
| 4,562,551 | 12/1985 | Inaba et al. | 364/513 |
| 4,566,845 | 1/1986 | Mouhamed | 414/735 |
| 4,571,694 | 2/1986 | Inaba et al. | 364/513 |
| 4,579,380 | 4/1986 | Zaremsky et al. | 294/119.1 |
| 4,591,944 | 5/1986 | Gravel | 361/170 |

FOREIGN PATENT DOCUMENTS

| | | |
|---|---|---|
| 2930006 | 2/1981 | Fed. Rep. of Germany . |
| 53-7071 | 1/1978 | Japan . |
| 503714 | 3/1976 | U.S.S.R. . |

OTHER PUBLICATIONS

"A Controlled Impedance Robot Gripper", Michael K. Brown, International Conference on Robotics, 1984.

Primary Examiner—William M. Shoop, Jr.
Assistant Examiner—Saul M. Bergmann

[57] ABSTRACT

An accurate high speed gripper assembly for use in handling articles in an automated manufacturing process. The gripper assembly includes a pair of movable fingers which depend from movable carriages mounted in a housing rotatably mounted on the end of a robot arm. A pair of stepper motors are mounted in the housing and are connected to rotary actuators which displace the fingers in discrete incremental steps toward or away from one another when rotated. Compliant elements provided on each finger cooperate with force/torque sensors for determining the proximity of the fingers to an article to be gripped and the gripping force applied by the fingers. The sensors generate signals which are processed in a controller that regulates operation of the stepper motors so as to achieve desired finger movements and gripper forces.

24 Claims, 7 Drawing Figures

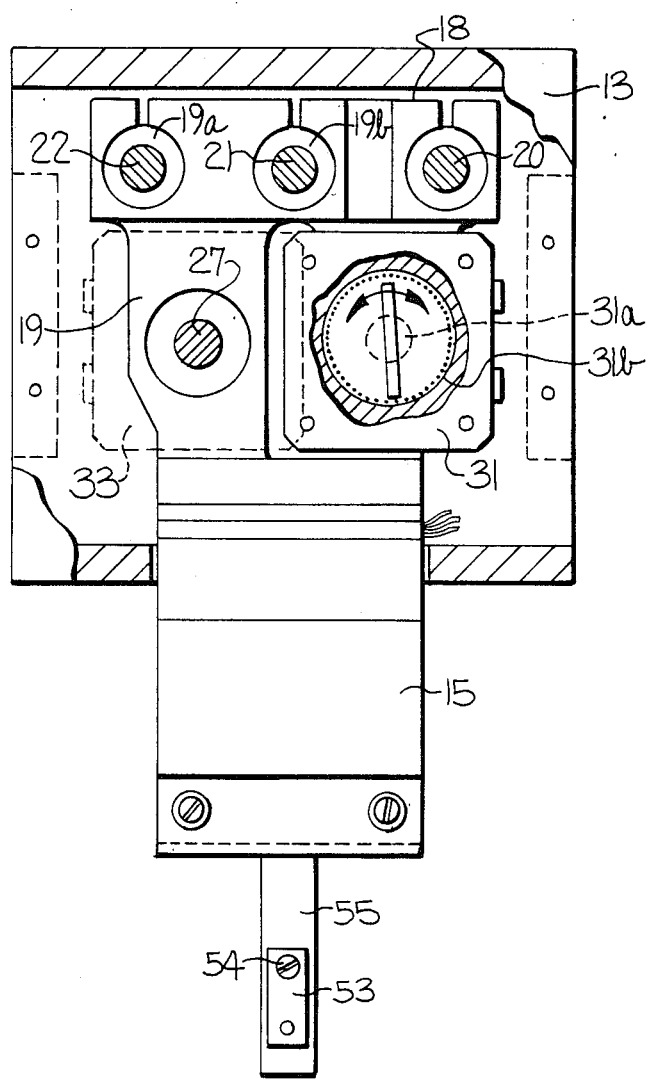

APPARATUS AND METHOD FOR HANDLING ARTICLES IN AUTOMATED ASSEMBLY PROCESSES

FIELD OF THE INVENTION

The present invention relates to automated assembly equipment and processes, and more particularly, the present invention relates to methods and apparatus for actuating gripper assemblies for robots.

BACKGROUND OF THE INVENTION

In automated assembly processes using robots, the robot arm is usually provided with a so-called end effector, or gripper assembly, for picking and placing parts. The gripper assembly generally includes a housing rotatably mounted to the end of the robot arm and a pair of fingers depending from the housing and movable relative to one another by appropriate actuators contained in the housing. In one known form of gripper assembly, the actuators include D.C. servo-motors which rotate threaded rods in one direction or another for displacing the fingers either toward or away from one another. With D.C. servo-motor actuator systems, the gripping force is a function of the the motor output torque, which in turn is a function of the motor input current. This permits the gripping force to be controlled by control of the current supplied to the motor.

While D.C. servo-motor controlled actuator systems have certain advantages when used to drive robot gripper fingers, they also have certain limitations. For instance, they require sophisticated and expensive detectors and the like for monitoring and controlling the positions and gripping forces of the fingers. They employ closed loop feedback control that is time dependent and that absorbs large amounts of the operational time and/or capacity of the computer associated therewith. Additionally, the analog nature of the D.C. servo-motor systems complicates interfacing thereof with computers of the preferred digital type.

The foregoing factors contribute significantly to the "computer overhead" expense, and thus to the overall relatively high cost, of gripper actuating systems employing D.C. servo-motors.

BRIEF DESCRIPTION OF THE PRIOR ART

Various types of gripper actuators are known. For instance, in Russian Patent 503714, the gripper jaws, or fingers, are driven by a differential gearing mechanism, similar to that used in automobiles, to impart simultaneous movement of the fingers until one engages an article to be gripped. At such point, input to the engaged finger terminates while the other finger continues to move toward the article for gripping the same. This provides a "variable centerpoint" capability for the gripper assembly.

U.S. Pat. No. 3,226,833 discloses automated measuring apparatus which includes movable jaws engageable with opposite sides of an article to be measured. In the embodiment of FIG. 3, one jaw is moved independently toward and away from the other jaw by a drive mechanism which includes a motor-driven, fine-pitch, lead screw. A separate drive motor rotates each lead screw.

U.S. Pat. No. 3,261,479 discloses a manipulating device including a pair of jaws which are moved by a single motor drive lead screw assembly having a connection which permits the jaws to be positioned independently of one another for providing a variable centerpoint gripping capability.

A gripper assembly such as described heretofore which utilizes separate D.C. servo-motors to drive the fingers is disclosed in an article entitled *A Controlled Impedance Robot Gripper* by Michael K. Brown, International Conference on Robotics, 1984. The fingers are displaced by means of a rack and pinion drive arrangement which cooperates with a variable capacitor to provide finger position information. The article discusses the effect on gripper performance of compliance within the gripper mechanism. The article also discusses proximity and gripping force sensing controls.

U.S. Pat. No. 3,226,833, discussed above, discloses the use of sensors for regulating the rate with which a gripper finger approaches an article. Japanese Patent 53-7071 is of similar import in its disclosure of gripper fingers provided with sensors and various types of compliance elements, including mechanical hinges, elastomeric supports, and mechanical springs. U.S. Pat. No. 4,132,318 also discloses force sensors combined with gripper fingers.

Patents of general interest with respect to gripper assemblies which include sensors and/or compliant means in association with the gripping fingers include U.S. Pat. Nos.: 3,449,008; 3,509,583; 3,620,095; 3,904,234; 4,132,318; 4,533,167; and Russian Patent 768633. Patents related to gripper drive assemblies not specifically discussed above include U.S. Pat. Nos.: 3,261,479; 4,423,998; and German Off. 29 30 006.

OBJECTS OF THE INVENTION

With the foregoing in mind, a primary object of the present invention is to provide a reliable, durable and relatively inexpensive gripper assembly for use with a robot.

It is another object of the present invention to provide an improved gripper assembly which is particularly suited for interfacing with, and being controlled by, digital computers.

Another object of the present invention is to provide a robot gripper assembly which is actuable by so-called "stepper motors" of the type which produce discrete incremental output motions in response to discrete electrical input pulses.

Still another object of the present invention is the provision, in a gripper activated by stepper motors, of compliant means permitting rapid and safe realization of gripping forces of desired, non-excessive magnitudes.

SUMMARY OF THE INVENTION

More specifically, the present invention provides an improved gripper assembly for use in combination with a robot in an automated manufacturing process. The gripper assembly includes a housing rotatably mounted on the end of a robot arm and a pair of movable fingers depending from carriages mounted in the housing for translation on guides which permit the fingers to be displaced laterally toward or away from opposite sides of an article to be handled. A separate stepper motor is operatively coupled to each carriage for displacing the carriage, and its connected finger. In response to its receipt of discrete electrical input pulses, each stepper motor undergoes discrete incremental angular displacements and thus causes its associated finger to undergo predetermined incremental displacements relative to the other finger. Monitoring of the pulses directed to each stepper motor enables the position of its associated finger to be readily ascertained at all times.

Control means is provided for regulating the step rate and other operations of each stepper motor in response to certain monitored or sensed conditions. The aforesaid conditions include the proximity of each finger to an article to be gripped, and the gripping force generated between each finger and the article. Both conditions may be and preferably are detected by a force/torque sensor located intermediate each finger and its associated carriage.

Compliant means associated with the fingers and having predetermined spring rates enables the forces applied to and/or reacted by the fingers to be safely detected and controlled, notwithstanding the fact that the incremental finger displacements produced by their stepper motor drive mechanisms are of fixed magnitudes. Additional compliant means, which has a low spring rate, enables the force/torque sensor associated with each finger also to function as the proximity sensor that detects the proximity of each finger to an article to be gripped.

In response to information received from its computer program and from the force/torque sensor, as well as from other sensing or monitoring mechanisms such as ones for monitoring the input pulses to each stepper motor, the control means so regulates the input electrical pulses to the stepper motors as to control the rates at which the fingers respectively approach and then close upon an article to be gripped, the force with which the article is gripped, the position at which the article is gripped, and/or the position of the article following gripping.

BRIEF DESCRIPTION OF THE DRAWINGS

The foregoing and other objects, features and advantages of the present invention should become apparent from the following description when taken in conjunction with the accompanying drawings, in which:

FIG. 5 is an end elevational view of the gripper assembly with portions of the housing broken away to expose interior details;

DESCRIPTION OF THE PREFERRED EMBODIMENT

Figure 1:
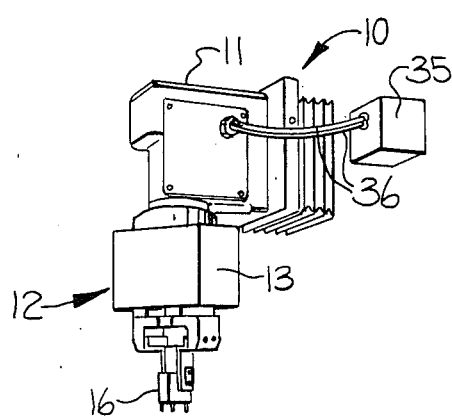
FIG. 1 is a perspective view in reduced scale of robotic equipment incorporating a gripper assembly embodying the present invention.
Figure 2:
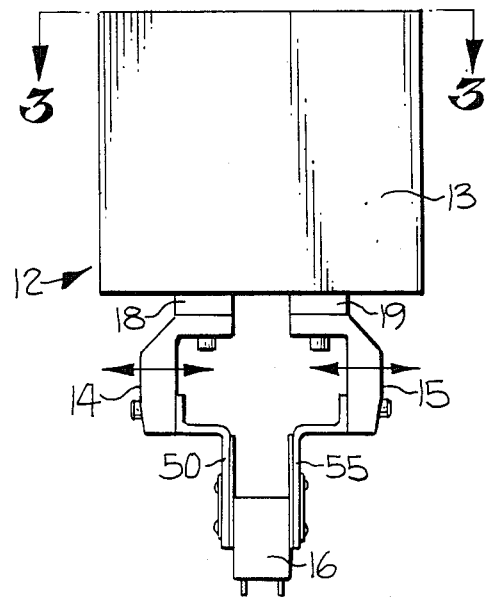
FIG. 2 is an enlarged front elevational view of the gripper assembly.

Referring now to the drawings, FIG. 1 illustrates a portion of an automated assembly device, or robot, 10 which includes an arm 11 and a gripper assembly 12 depending therefrom and rotatably mounted thereto for movement about a vertical axis. Referring now also to FIG. 2, the gripper assembly 12 includes a housing 13 and a pair of gripper fingers, or end effectors, 14, 15, depending therefrom for picking and placing articles, such as the electronic part 16. In the illustrated embodiment, the part 16 is gripped by finger pressure applied inwardly against opposite sides thereof. It should be understood, however, that the fingers 14, 15 may be provided with suitable attachments whereby interior surfaces of a part, such as the inside of a hole, may be engaged by the fingers and gripped by pressure applied outwardly rather than inwardly in the manner illustrated.

Figure 3:
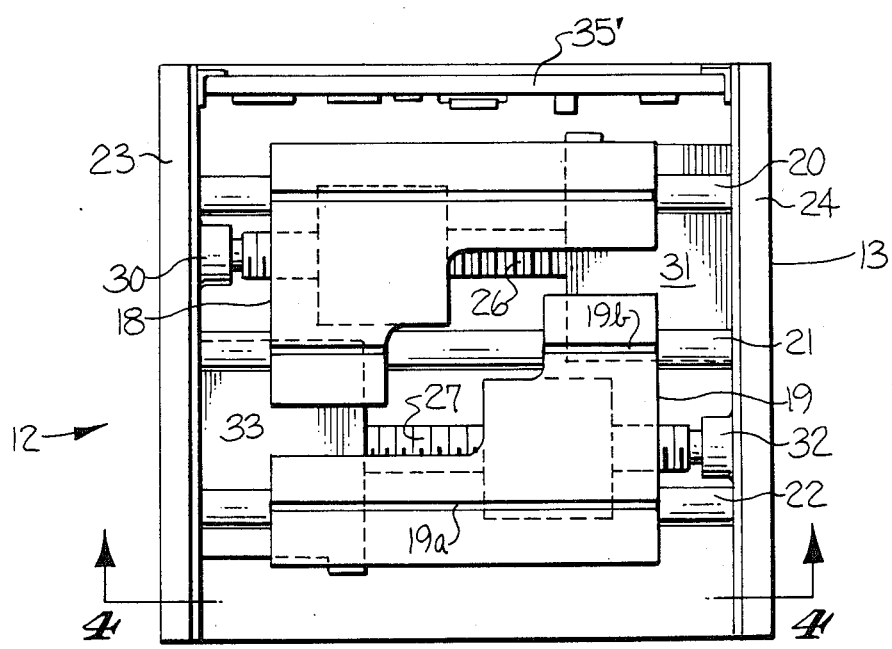
FIG. 3 is a sectional view taken on line 3—3 of FIG. 2.

The fingers 14 and 15 are displaced either toward or away from another in the direction indicated by the arrows in FIG. 2. For this purpose, the fingers 14, 15 are connected at their upper ends to carriages 18, 19, respectively, mounted for linear movement inside the housing 13. As best seen in FIG. 3, the finger carriages 18, 19 are mounted for translation on a plurality of guide rods 20, 21 and 22 connected at their opposite ends to a pair of parallel frame members 23, 24 forming the sides of the housing 13 (FIG 2). Each carriage, such as the carriage 19, has an enlarged portion 19a within which is mounted a pair of parallel linear ball bearing assemblies 19a, 19b (FIG. 5) engaging the guide rods 22 and 21, respectively. As best seen in FIG. 3, the carriages 18, 19 are configured in plan in such a manner as to permit the fingers 14, 15 (FIG. 2) to be moved into close proximity with one another, such as in the manner illustrated in FIG. 4. Preferably, the rods 20–22 are sized and the carriages 18, 19 are configured to permit the fingers 14, 15 (FIG. 2) each to be displaced through a preselected distance of, for example, about one inch.

Each carriage, and hence finger, is driven separately. For this purpose, the carriages 18, 19 are advanced back and forth on the guide rods 20–22 by means of an actuator provided in the housing 13 for each carriage 18, 19. As best seen in FIG. 3, each actuator operates in response to a rotary input motion to displace its associated carriage. In the present instance, the actuators include lead screws, or threaded rods, 26, 27 extending parallel to the guide rods 20–22. Each lead screw, such as the lead screw 26, is externally threaded and engages internal threads within the body of the carriage 18. Preferably each lead screw is provided by a so-called ball screw, and the internal threads in each carriage are provided by a so-called ball nut which matingly engages the ball screw. One end of the lead screw 26 is rotatably supported in a bearing 30 connected to the frame member 23, and the opposite end of the lead screw 26 is rotatably connected to an electric motor 31 operable to rotate the lead screw 26 in one direction or another, as will be discussed. The lead screw 27 is similarly mounted to the opposite frame member 24 by a bearing 32 and is driven by an electric motor 33 fastened to the opposite frame member 23. With this construction, rotation of either lead screw in one direction or the other displaces its associated carriage and hence the finger depending therefrom, either inwardly or outwardly.

Motors 31, 33 are of the so-called "stepper" type, as opposed to a D.C. servo type. As is schematically indicated in FIG. 5, with respect to motor 31, a stepper motor conventionally includes a rotor 31a which undergoes angular displacement, relative to stator poles 31b and in discrete incremental whole or partial steps of predetermined finite magnitude, in response to discrete electrical input pulses. By way of illustration, each stepper motor 31, 33 may undergo 200 "full steps" per complete revolution, and may thereby effect a displacement of its associated gripper finger 14 or 15 toward or away from the other finger through a distance of approximately 0.0005 inches in response to each "full step" input pulse received by the motor, and through a distance of approximately one-half that amount (approximately 0.00025 inches) in response to a "half step" input pulse. The number of steps per second through which the motors, and therefore their associated fingers, can be driven is capable of variation during operation of the motors between a relatively high "travel" or "approach" rate (e.g. 5000–7000 steps per second) and a lower "pull-in" or "closing" rate (e.g. less than 1000 steps per second) that permits rapid stoppage of the motor when desired. The speed with which the motor step rate can be changed without loss of positional control is called the motor ramp rate. A high ramp rate is desired and is possessed by motors 31, 33. A very desirable attribute of motors 31, 33, in keeping with other motors of the stepper type, is their compatability and ease of association with digital type control systems and computers.

The operation of gripper assembly 12 is controlled by control means 35, schematically shown in FIG. 1, having suitable electrical leads 36. Control means 35 includes a programmable digital computer, disposed at any convenient location, that may and normally would be linked with the master computer (not shown) directing the overall operation of robot 10. Control means 35 controls the rotational speed and directions of motors 31 and 33 in response to data and instructions received from its computer program and from various sensors. The latter includes an internal pulse counter (not shown) that monitors the number and type of input electrical pulses directed to each stepper motor 31, 33 and thus enables the position of each of the fingers 14, 15 to be rapidly and easily determined by the control means computer.

Figure 4:
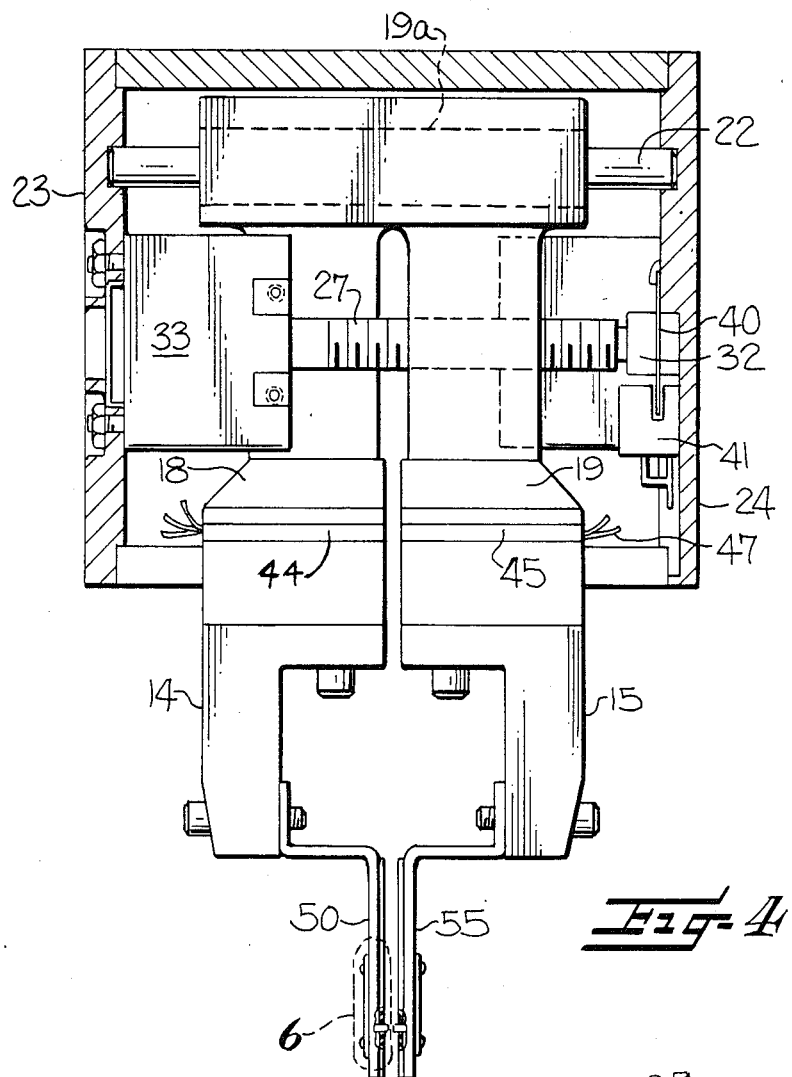
FIG. 4 is a sectional view taken on line 4—4 of FIG. 3.

In order to provide a back-up indication of the position of each finger, a means may be and illustratively is provided in the housing 13 for measuring the rotational displacement of each lead screw and producing an appropriate signal which is processed in the control means 35 following amplification and/or other preliminary processing thereof within a preprocessor 35' (FIG. 3) located within housing 13. To this end, as best seen in FIG. 4, encoder means 40, 41 is associated with each lead screw, such as the lead screw 27. The encoder means includes a disc 40 mounted for rotation on the screw 27, adjacent the end thereof remote from its drive motor 33, and a pick-up assembly 41 mounted to the frame 24. The pick-up assembly 41 cooperates with the disc 40 to produce an electrical output pulse each time the disc 40 rotates through a predetermined angle. The encoder assembly 40, 41 may be of the so-called optical type, wherein the disc 40 is provided with a plurality of holes and the sensor 41 is adapted to pass a pair of light beams through the holes for producing a signal, which is also indicative of the direction of disc rotation, each time a hole passes through the beams. Encoders of the aforesaid type are relatively inexpensive and are commercially available from various sources, including the Hewlett-Packard Corporation. By monitoring the pulses produced by the encoder assembly 40, 41, the control means 35 is capable of determining the position of each finger, such as the finger 15, with sufficient accuracy as to adequately perform its desired back-up function.

Control means 35 also receives signals, via its preprocessor 35', from force/torque sensors 44, 45 respectively located (see FIG. 4) between each gripper finger 14, 15 and its supporting carriage 18, 19. In association with the computer components of control means 35, each sensor 44, 45 detects and identifies the forces applied to its associated finger along three mutually perpendicular axes, and the moments about such axes. A preferred force/torque sensor is that manufactured by Lord Corporation, of Erie, Pa., and designated as Model LTS 210 V. The sensitivity and accuracy of the force/torque data obtained is enhanced by the location of sensors 44, 45 in close proximity to their associated fingers 14, 15 and by the close proximity of signal preprocessor 35' to the sensors. In addition to other functions, preprocessor 35' amplifies and filters noise from raw signal data received from strain gauge components (not shown) of sensors 44, 45.

Compliant means are provided in association with each gripper fingers 14, 15. In the form thereof best shown in FIGS. 4 and 6 with respect to finger 14, the compliant means includes a layer or pad 51 of resilient elastomeric material upon the article confronting inner face of the article engaging leg 50 of finger 14. Pad 51 undergoes compression-type deflection in response to its engagement with an article, such as that designated in FIG. 1 by the numeral 16, to be gripped. During its transition from an uncompressed to a highly compressed condition, the pad deflection sufficiently moderates the rate of increase of the gripping forces generated between finger 14 and the article as to allow the changing magnitude of such forces to be successfully detected by sensors 44 and regulated by control means 35. The inadvertent generation of gripping forces of greater than desired magnitude, with possible ensuing damage to the gripper assembly and/or the gripper article, is thus avoided.

Figure 6:
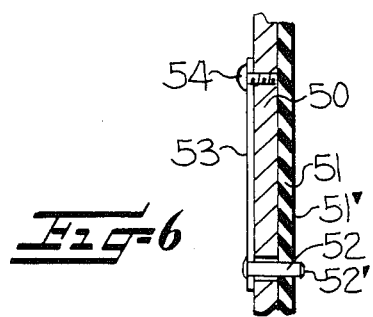
FIG. 6 is an enlarged fragmentary sectional view of the portion of the gripper finger delineated in FIG. 5.

Also associated with each finger 14, 15 is a means for sensing when movement of the finger has brought it into close proximity to an article to be gripped. In the form thereof shown in FIG. 6 with respect to finger 14, the proximity sensing means includes a laterally extending pin 52 mounted adjacent the lower end of a compliant leaf spring 53 connected at its upper end to leg 50 of finger 14. Pin 52 extends through aligned bores within finger leg 50 and its pad 51, and is biased by spring 53 to a position, such as shown in FIG. 6, wherein its free end 52' is located a preselected small distance (e.g. 0.030–0.050 inches) to the right of surface 51' of pad 51. The outer end 52' of pin 52 is adapted to engage the article to be gripped, such as the part 16 of FIG. 2, before pad 51 engages the same, and to be displaced to the left by such engagement. The spring rate of spring 53 is considerably lower than that of pad 51, preferably being just sufficient to ensure detection by sensor 44 of the low magnitude force transmitted by the spring to finger 14 during and as a result of initial leftward displacement of pin 52.

A compliant pad and a leaf spring/pin assembly identical to those associated with leg 50 of finger 14, and described above, are also provided in association with leg 55 of gripper finger 15.

At the outset of operation of gripper 12 in a method of picking and placing an article, at least one of its gripper fingers, for example finger 14, likely will be disposed relatively distant from the article to be gripped. Assuming such to be the case, control means 35 initially causes stepper motor 31 to drive the finger at its relatively high "travel" or "approach" rate (e.g. 5000–7000 steps per second) and in full-step increments. Finger 14 continues its rapid travel until it is proximate the article to be gripped. In response to then ensuing engagement of pin 52 with the article, and resulting detection by sensor 44 of the low level force then transmitted to the finger by leaf spring 53, control means 35 causes motor 31 to decelerate (at or near its ramp rate) to its reducing "pull-in" or "closing" step rate. The control means then causes the motor and finger to be driven at its reduced pull-in rate (e.g. 1000 steps per second or less) and in half (or other partial) step increments. At the same time control means 35 causes the gripping forces upon finger 14 to be monitored following each incremental step of motor and finger movement. The movement of finger 14 during its aforesaid deceleration brings the compliant pad 51 thereon closely adjacent the article to be gripped. Engagement between the article and pad, and thereafter ensuing progressive compression of the pad, therefore occurs promptly after commencement of movement of the finger at its pull-in rate. The progressive pad compression moderates the rate of increase of the gripping forces generated between the finger and the article during pull-in movement of the finger. This allows the pull-in movement of the finger to be halted by control means 35 when the magnitude of the gripping forces detected by sensor 44 has either reached a desired value or, as would more frequently be the case in view of the step-wise nature of the finger's movement, has approached the desired magnitude as closely as is possible. The other finger of the gripper assembly is similarly but independently positioned either before, during or after positioning of finger 35, and such positioning may be used to control gripping force and to equalize the forces applied to the fingers. Following gripping of the article by both fingers, movement thereof in unison at the desired rate of the stepper motors may be effected by control means 35 to adjust as desired the lateral position of the article relative to the housing of the gripper assembly.

Since gripper assembly 12 employs stepper-type drive motors that operate in response to discrete input pulses, the assembly is highly compatible with digital computer and controllers, and interfaces readily with them. Additionally, the position of the fingers during at least most of the operation of the assembly can be readily ascertained with adequate accuracy simply by monitoring of the motor input pulses. This greatly reduces and may altogether eliminate the need for sophisticated and expensive position detectors and closed-loop feedback systems such as place heavy demands upon the available computer time and/or capacity.

There are of course numerous known types of "proximity" sensors, such as radiant energy devices, pneumatic devices, etc. While these could be employed in assembly 12, the proximity sensor previously described is preferred since it is highly reliable in operation and utilizes the force/torque sensors 44, 45 that in any event form part of the gripper assembly. The dual purpose use of such sensors contributes to the relatively modest cost and compact size of assembly 12.

Figure 7:
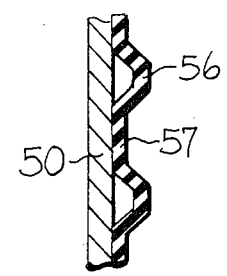
FIG. 7 is an enlarged fragmentary sectional view, similar to FIG. 6, but of a modified embodiment of the present invention.

In lieu of the pad 51 and other components thereon shown in FIGS. 4 and 6, the legs 50, 55 of gripper fingers 13, 14 may be provided with an elastomeric pad, such as fragmentarily shown in FIG. 7, having protrusions 56 projecting from a base section 57. The protrusions 56 have a low spring rate and perform the same function as the leaf spring/pin assembly shown in FIGS. 4 and 6. The base section 57 has a relatively high spring rate in keeping with that of the pads 51 of FIGS. 4 and 6.

The gripper assembly of the present invention is particularly well suited for handling light electronic parts which must be gripped by their leads, as well as handling electronic parts which must be gripped by their bodies. Body gripping creates problems for many automated assembly procedures because the relationships between the leads and the bodies are not always precisely defined. In such instances, there is a need for the gripper assembly to have a so-called variable centerpoint capability. In the present invention, the independent actuation of the fingers permits the gripping assembly to search for the sides of a component having variable body to lead relationships and to center itself. Accordingly, the gripper assembly of the present invention is particularly well suited for use in placing electronic components which were heretofore difficult to handle.

While a preferred embodiment of the present invention has been described in detail, various modifications, alterations and changes may be made without departing from the spirit and scope of the present invention as defined in the appended claims.

We claim:

1. For use in connection with a robotic article handling apparatus, a gripper assembly for handling an article, comprising:
   a housing,
   a pair of fingers depending from said housing,
   guided carriage means in said housing mounting said fingers for independent selective movement toward and away from one another,
   a separate stepper motor operable in response to discrete electrical pulses and drivably connected to each finger for effecting said movement thereof in discrete incremental steps of predetermined extent and at selected step rates proportional to the rates of said electrical pulses, said step rates including a relatively high approach rate at which said finger is driven toward an article to be handled and a relatively low closing rate at which said finger is driven when in proximity with the article,
   proximity sensing means associated with each finger for sensing its proximity with said article,
   force sensing means associated with each finger for sensing the gripping forces generated by gripping engagement between the finger and said article,
   compliant means associated with each finger for undergoing progressive displacement in respones to increase of said gripping forces,
   digital-type control means connected to each said motor and sensing means for so controlling the rate of said electrical pulses as to cause said motor to vary the step rate of said incremental movement of said finger driven thereby, said control means being operable in response to sensed proximity of said finger to said article to cause reduction of the rate of movement of said finger from its said approach rate to its said closing rate, and said control means being operable to cause cessation of movement of said finger when a predetermined magnitude of gripping force has been sensed by said force sensing means.

2. A gripper assembly according to claim 1 wherein said proximity sensing means includes said force sensing means.

3. A gripper assembly according to claim 1 wherein said control means includes means for monitoring said pulses and for thereby determining the position of the finger driven by each said motor.

4. A gripper assembly according to claim 1 wherein said compliant means includes an elastomeric element having a predetermined spring rate.

5. A gripper assembly according to claim 4 wherein said elastomeric element is mounted on said finger.

6. A gripper assembly according to claim 5 wherein both fingers are of like construction and cooperate with their respective stepper drive motors and control means to grip an article frictionally therebetween.

7. A gripper assembly according to claim 5 wherein said proximity sensing means includes a contact element normally extending beyond said finger and said elastomeric element thereon for engaging the article before said elastomeric element engages the article, and resilient means mounting said contact element for retractive movement in response to its said engagement with the article.

8. A gripper assembly according to claim 7 wherein said resilient means has a spring rate which is substantially lower than the spring rate of said elastomeric element.

9. A gripper assembly according to claim 8 wherein said resilient means is a leaf spring mounted to said finger for movement relative thereto and relative to said elastomeric element.

10. A gripper assembly according to claim 1 wherein said proximity sensing means and said force sensing means each includes a force/torque sensor connected between said finger and its guided carriage means.

11. A gripper assembly according to claim 1 wherein the incremental steps of movement of said finger include whole steps and partial steps, and wherein said control means is operable in response to sensed proximity of said article to said finger to change the incremental movement of said finger from whole to partial steps.

12. A gripper assembly according to claim 1 including means carried by said housing for detecting the rotational displacement of each of said motors and producing signals in response to said rotation for providing finger position sensing information.

13. In a gripper assembly for use in combination with robotic article handling apparatus, said gripper assembly including a housing, a pair of gripper fingers depending from said housing, and means mounting said fingers for independent movement relative to each other and relative to an article to be gripped, the improvement comprising:

a pair of stepper-type drive motors operatively connected to respective ones of said fingers for, in response to discrete electrical input pulses directed thereto, causing said fingers to undergo said independent movement in discrete incremental steps of preselected magnitudes and at preselected step rates, said rates including a relatively high approach rate adapted for use as a finger approaches an article to be gripped, and a relatively low closing rate adapted for use as the finger moves into gripping engagement with the article, proximity sensing means for sensing proximity of each of said fingers to an article, force sensing means for sensing gripping forces generated by engagement between said fingers of an article, compliant means associated with each finger for undergoing progressive displacement in response to increased gripping forces generated by engagement between said finger and said article, and control means operatively associated with said sensing means and motors for effecting changes in the rate and magnitude of the incremental steps of movement of said fingers.

14. A gripper assembly according to claim 13 wherein said compliant means includes at least first and second elastic elements having different spring rates, the first element having the lower spring rate and being mounted on the finger for engaging the article and comprising part of said proximity sensing means.

15. A gripper assembly according to claim 13 wherein said second elastic element includes an elastomeric pad mounted on said finger, and said first elastic element includes a protrusion extending laterally from said finger beyond said elastomeric pad, and means mounting said protrusion to said finger for displacement relative to said 16. A gripper assembly according to claim 13 wherein each of said finger mounting means includes a carriage slidable on a track, and including force/torque sensor means mounted between said carriage and the finger depending therefrom for sensing forces and torques applied to the finger when engaged with the article.

17. In a gripper assembly for use in combination with robotic article handling apparatus, said gripper assembly including a housing, a pair of gripper fingers depending from said housing, and means mounting said fingers for independent movement relative to each other and relative to an article to be gripped, the improvement comprising:

a pair of stepper-type drive motors operatively connected to respective ones of said fingers for, in response to discrete electrical input pulses directed thereto, causing said fingers to undergo said independent movement in discrete incremental steps of preselected magnitudes, force sensing means for sensing forces generated by contact with said fingers of an article, compliant means associated with each finger for undergoing progressive displacement at a predetermined spring rate in response to increased contact forces generated by engagement between said finger and said article, and control means operatively associated with said sensing means and said motors for effecting selected changes in the magnitude of the incremental steps of movement of said fingers.

18. In a method of picking an article for placement in an automated assembly process, wherein a pair of fingers are displaced relative to one another for engaging spaced surfaces on the article, the improvement wherein said finger displacing step is effected by causing a stepper motor operatively coupled to each finger to advance through a series of discrete angular positions about its axis of rotation at a predetermined step rate for causing each finger to approach the article surfaces at a predetermined rate, sensing the proximity of each finger to the confronting article surface, and in response to the sensed proximity, reducing the step rate of the stepper motor to a closing step rate less than said predetermined approach step rate, interposing between the fingers compliant means having a predetermined compressive spring rate, sensing said compression of said compliant means, and in response to a predetermined compression of said compliant means arresting further angular displacement of said stepper motor.

19. The method according to claim 18 wherein said proximity and compression sensing steps include the step of engaging an elastomeric pad on the fingers against the article and measuring the force and torque applied to the fingers.

20. The method according to claim 18 including the step of decreasing the step rate between said approach rate and said closing rate at a predetermined ramp rate.

21. The method according to claim 18 wherein said stepper motor advances through 200 angular steps per revolution, said approach step rate is less than about 7000 steps per second, and said closing step rate is less than about 1000 steps per second.

22. The method according to claim 18 wherein said proximity sensing step includes the step of contacting the article with a deflectable member carried by the finger at a location spaced from the finger before the finger engages the article, and measuring the force on the finger caused by deflection of said deflectable member relative to the finger.

23. The method according to claim 18 including the steps of supplying discrete pulses to the stepper motors, counting the pulses supplied, and in response thereto, determining the position of the fingers relative to the article.

24. The method according to claim 18 wherein said compression sensing step includes the step of measuring the force exerted by the article on each finger when engaged therewith, and displacing one finger relative to the other for substantially equalizing the forces on the fingers.

* * * * *